United States Patent
Furukubo et al.

(10) Patent No.: US 6,617,059 B1
(45) Date of Patent: Sep. 9, 2003

(54) METHOD OF FORMING SILICON CARBIDE FILM ON ALUMINUM NITRIDE, FILM STRUCTURE AND SILICON CARBIDE FILM

(75) Inventors: Hiroshi Furukubo, Nagoya (JP); Hirotake Yamada, Nagoya (JP); Hiromichi Kobayashi, Nagoya (JP)

(73) Assignee: NKG Insulators, Ltd., Nagoya (JP)

( * ) Notice: Subject to any disclaimer, the term of this patent is extended or adjusted under 35 U.S.C. 154(b) by 0 days.

(21) Appl. No.: 09/819,933

(22) Filed: Mar. 28, 2001

(30) Foreign Application Priority Data

Mar. 29, 2000 (JP) ........................ 2000-090616

(51) Int. Cl.[7] ................................. B32B 9/04
(52) U.S. Cl. .................. 428/698; 428/192; 428/220; 428/699; 428/704
(58) Field of Search ................ 428/192, 220, 428/698, 699, 704

(56) References Cited

U.S. PATENT DOCUMENTS 5,886,863 A * 3/1999 Nagasaki et al. ........... 361/234

FOREIGN PATENT DOCUMENTS

JP    10-256108 A   *  9/1998

* cited by examiner

*Primary Examiner*—Deborah Jones
*Assistant Examiner*—G. Blackwell-Rudasill
(74) *Attorney, Agent, or Firm*—Burr & Brown

(57) ABSTRACT

A film structure including a silicon carbide film formed on a surface of an aluminum nitride substrate. The substrate has a first base plane, a second base plane positioned downward with respect to the first base plane and a step plane arranged in an intersecting direction between the first base plane and the second base plane. One or more chamfered planes are arranged between the first base plane and the step plane so as to form a plurality of corner portions each having an angle larger than 130°. Alternatively, at least one round portion having a curvature radium of larger than 0.05 mm is arranged between the first base plane and the step plane.

7 Claims, 2 Drawing Sheets

METHOD OF FORMING SILICON CARBIDE FILM ON ALUMINUM NITRIDE, FILM STRUCTURE AND SILICON CARBIDE FILM

BACKGROUND OF THE INVENTION

1. Field of the Invention

The present invention relates to a method of forming a silicon carbide film on aluminum nitride, a film structure and a silicon carbide film.

2. Description of Related Art

A dense aluminum nitride has an excellent corrosion resistivity with respect to a halogen series corrosive gas. Moreover, the dense aluminum nitride is known as a high heat conductive material, and a volume resistivity thereof is larger than $108\Omega\cdot cm$. In addition, the dense aluminum nitride has an excellent thermal shock resistivity. Therefore, it is assumed that a substrate for an electrostatic chuck and a heater used for a semiconductor manufacturing apparatus is preferably formed from aluminum nitride.

On the other hand, a method of forming a silicon carbide film on a surface of a substrate made of, for example, carbon by a chemical vapor deposition method is disclosed in Japanese Patent Publication Laid-Open publication No. 10-256108 (JP-A-10-256108). Such a silicon carbide film is dense and shows an excellent corrosion resistivity.

The inventors have investigated a silicon carbide film as a corrosion resistive member exposed to a corrosive gas in a semiconductor manufacturing apparatus in such a manner that the silicon carbide film was formed on a surface of the aluminum nitride substrate by the chemical vapor deposition method. Usually, the member used in the semiconductor manufacturing apparatus has a corner portion.

However, during this investigation the inventors found a phenomena such that the silicon carbide film peeled off at portions near the corner portion of the substrate. Such a silicon carbide film peeling off did not occur at a portion other than the corner portion, and the reason was not certainly understood. For example, as shown in FIG. 3, it is assumed that a silicon carbide film 4 is formed on a surface of a substrate 11. The substrate 11 comprises a first base plane 11a arranged upward, a second base plane 11c positioned downward to the first base plane 11a and a step plane 11b arranged perpendicularly between the first base plane 11b and the second base plane 11c. If the silicon carbide film 4 is formed on the substrate 11, the silicon carbide film 4 is not peeled off at near a corner portion 11d positioned downward, but the silicon carbide film 4 is sometimes peeled off at near a corner portion 11e positioned upward,

SUMMARY OF THE INVENTION

An object of the present invention is to provide a method of forming a silicon carbide film on a substrate made of aluminum nitride by a chemical vapor deposition method, which can prevent a silicon carbide film peel-off at near corner portions when the substrate has a step.

According to a first aspect of the invention, a method of forming a silicon carbide film on a substrate made of aluminum nitride by chemical vapor deposition includes a step of forming the silicon carbide film on the substrate made of aluminum nitride. The substrate includes a first base plane, a second base plane positioned downward with respect to the first base plane and a step plane arranged in an intersecting direction between the first base plane and the second base plane. One or more chamfered planes are arranged between the first base plane and the sup plane so as to form a plurality of corner portions each having an angle larger than 130°.

Moreover, according to a second aspect of the invention, a method of forming a silicon carbide film on a substrate made of aluminum nitride by chemical vapor deposition includes a step of forming the silicon carbide film on the substrate made of aluminum nitride. The substrate includes a first base plane, a second base plane positioned downward with respect to the first base plane and a step plane arranged in an intersecting direction between the first base plane and the second base plane. At least one round portion having a curvature radium of larger than 0.05 mm is arranged between the first base plane and the step plane.

Further, the other aspects of the invention relate to a film structure and a silicon carbide film, in which a silicon carbide film is formed on a substrate made of aluminum nitride in the manner mentioned above.

BRIEF DESCRIPTION OF THE DRAWINGS

For better understandings of the present invention, reference is made to the attached drawings wherein.

DESCRIPTION OF THE PREFERRED EMBODIMENT

Figure 1:
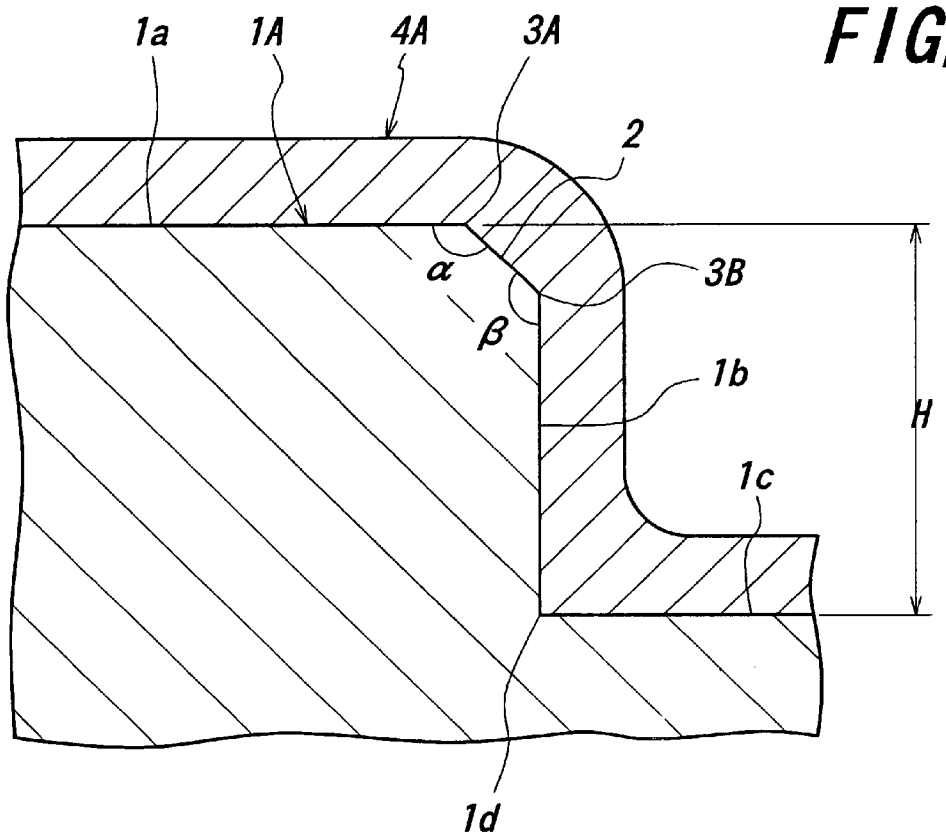
FIG. 1 is a cross sectional view for explaining a method of forming a silicon carbide film on a substrate in which one chamfer plane is arranged to form two corner portions between a first base plane and a step plane.

The inventors have investigated a case such that, when a silicon carbide film was formed on a substrate made of aluminum nitride by chemical vapor deposition method, the silicon carbide film was peeled off at near corner portions after cooling. The peeled-off portion is particularly large when a thickness of the silicon carbide film is larger than 50 $\mu m$ and a depth of a step between a first base plane and a second base plane is larger than 100 $\mu m$. Therefore, it is assumed that a tensile stress generated in the silicon carbide film is contributed to this film peel-off. However, this phenomenon does not occur as much if the substrate is made from a material other than aluminum nitride.

Then, characteristics of the silicon carbide film which peeled off from near the corner portion of the substrate was measured. As a result, it has been found that an electric conductivity of the peeled-off silicon carbide film became larger than that of the other normal silicon carbide film. It is assumed that as aluminum element is distributed from aluminum nitride constituting the substrate into the silicon carbide film. In addition, it is assumed that the silicon carbide film is embrittled due to the aluminum element distribution, and the silicon carbide film is easy to peel off at the corner portion.

Under such conditions, the inventors discovered that the above-discussed problems could be prevented if one or more chamfered planes are arranged between the first base plane and the step plane so as to form a plurality of corner portions, and an open angle of respective corner portions are set to larger than 130°. Hereby, it is possible to prevent the application of an excess stress, which causes the peeling-off of the embrittled silicon carbide film. In this manner, the present invention can be achieved.

It is preferred to set an open angle of respective corner portions to larger than 135°. Moreover, the number of the corner portions is not limited, and can be larger than three. However, since a working operation is difficult if the number of the corner portions is too numerous, it is preferred to set the number of the corner portions to smaller than four.

An upper limit of the open angle of respective corner portions is not defined. However, if the upper limit is too large, it is necessary to increase the number of the corner portions. From this standpoint, it is preferred to set the open angle of the corner portion to smaller than 157.5°.

Moreover, the inventors have also found that, an excess stress causing peeling-off is not applied to the embrittled silicon carbide film, if a curvature radius of respective corner portions is larger than 0.05 mm.

When a curvature radius of respective corner portions is set to larger than 0.05 mm, the open angle of respective corner portions is not particularly limited, and it is for example 90°–170°. However, it is found that, even in the case that the open angle of respective corner portions is smaller than 130°, or further smaller then 125°, if a curvature radius of respective corner portions is set to larger than 0.05 mm, the film is not peeled off.

Preferably, the curvature radius of the corner portion is set to larger than 0.1 mm. An upper limit of the curvature radius is not defined. However, workability is improved if it is smaller than 0.3 mm.

It is preferred that a thickness of the silicon carbide film is larger than 50 μm. Thereby, an overall surface of the substrate can be coated stably by the silicon carbide film. Moreover, when such a thick silicon carbide film is formed, since the silicon carbide film is particularly prone to peeling-off, the present invention is effective.

It is further preferred that a thickness of the silicon carbide film is larger than 100 μm. Moreover, from an economical standpoint, it is preferred that a thickness of silicon carbide film is smaller than 3000 μm.

In the case that a height of a step between the first base plane and the second base plane is larger than 100 μm since the silicon carbide film is particularly prone to peeling-off, the present invention is particularly effective. That is to say, according to the present invention, it is possible to form the silicon carbide film on a surface of the aluminum nitride substrate having the step of larger than 100 μm height in a highly efficient manner.

Figure 2:
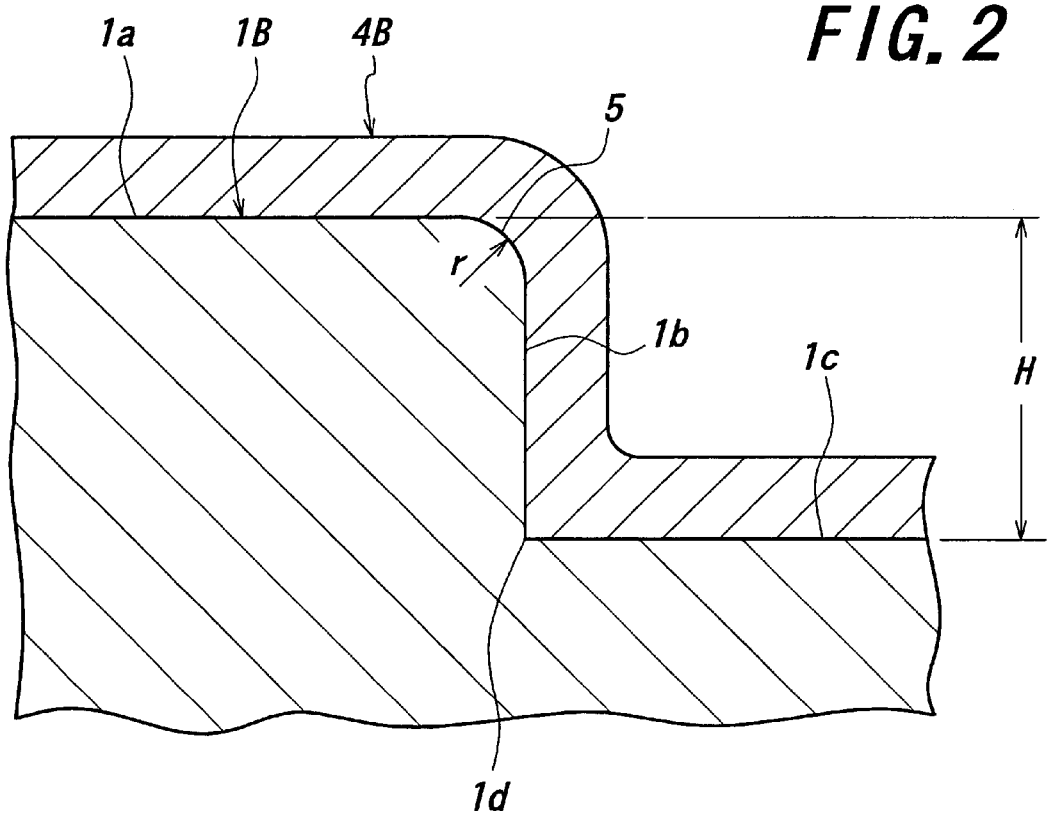
FIG. 2 is a cross sectional view for explaining a method of forming a silicon carbide film on a substrate in which one corner portico is arranged.
Figure 3:
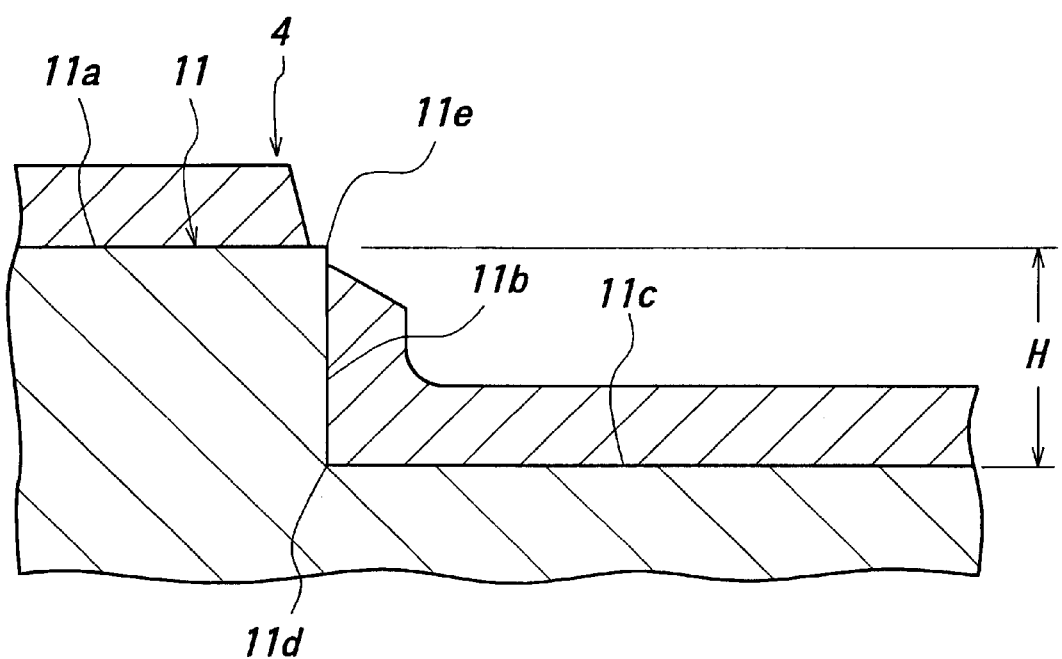
FIG. 3 is a cross sectional view showing one embodiment in which a silicon nitride film is formed on a substrate.

FIG. 1 and FIG. 2 are cross sectional views respectively showing an embodiment according to the invention in which a silicon carbide film 4A or 48 is formed on a substrate 1A or 1B.

In FIG. 1, the substrate 1A comprises a first base plane 1*a*, a second base plane 1*c* and a step plane 1*b* arranged between the first but plane 1*a* and the second base plane 1*c*. Two corner portions 3A and 3B are formed between the first base plane 1*a* and the step plane 1*b*, and a chamfered plane 2 is formed between the corner portions 3A and 3B. An open angle a of the corner portion 3A and an open angle β of the corner portion 3B are larger than 130° respectively. A symbol H is a height of a step between the first base plane 1*a* and the second base plane 1*c*.

In this embodiment, since the first base plane 1*a* and the step plane 1*b* are arranged perpendicularly with each other, α+β is 270°. An intersecting angle between the first base plane 1*a* and the step plane 1*b* is not limited to 90° (perpendicular), but it is possible to set the intersecting angle in a range of 30°–130°.

In FIG. 2, one round portion 5 is formed between the first base plane 1*a* and the step plane 1*b*, and a curvature radius r of the round portion 5 is set to larger than 0.05 mm.

Preferable film forming conditions are as follows. The substrate is set in a furnace. A hydrogen gas is flowed in the furnace for a while at a film forming temperature. After that, a hydrogen gas and a silicon forming compound are introduced into the furnace for a short time period. Then, a hydrogen gas, a silicon forming compound and a carbon forming compound are introduced into the furnace so as to form a silicon carbide film on the substrate. As the silicon forming compound, use is made of $SiCl_4$, $SiHC_3$, $SiCl_2H_2$, $SiH_4$. As the carbon forming compound, use is made of $CH_4$, $C_2H_6$, $C_3H_8$.

The following is particularly preferred. At first, a hydrogen gas is flowed at a film forming temperature. Then, a gas of silicon forming compound including at least silicon and chlorine is flowed. Then, a gas of carbon forming compound is flowed. Thereby, a contact property between the silicon carbide film and the aluminum nitride substrate can be improved more and more, and the silicon carbide film is hardly peeled off.

In this manner, during a growth due to a chemical vapor for deposition, if a gas of a first silicon forming compound including at least chlorine is introduced at a high temperature region prior to an introduction of the carbon forming compound gas, silicon chloride is reacted with hydrogen and is dissolved so as to generate hydrogen chloride. The thus generated hydrogen chloride gas functions to corrode and activate a surface of aluminum nitride. Here, it is assumed that (1) a silicon atom is coupled to form a silicon nitride, (2) the introduced carbon is easy to react with silicon and (3) the thus formed silicon carbide is easy to contact with respect to the base silicon nitride.

An introducing time of the first silicon forming compound including chlorine is determined appropriately m generate an intermediate layer having predetermined thickness in relation to the film forming temperature. It is preferred to set the film forming temperature in a range of 1350–1550° C. more preferably in a range of 1400–1450° C.

it is possible to further improve heat cycle resistivities of the substrate and the silicon carbide film by making a purity of aluminum nitride larger than 90% more preferably larger than 94%. This is because an affection of oxide in the substrate can be suppressed. It is preferred from viewpoints of strength and heat conduction that a relative density of the substrate is larger than 94%.

It is preferred that a main crystal phase of the silicon carbide film is 3C crystal phase or 6H crystal phase.

It is preferred that a purity of the silicon carbide film is larger than 99.99% more preferably larger than 99.9999%. It is preferred that the silicon carbide film is a complete dense body having a theoretical relative density in a order of 0.1%.

A film structure of the silicon carbide film and the substrate manufactured according to the present invention can be applied for various products. For example, the film structure can be applied for a combustion chamber for gas turbine, a static wing, a dynamic wing, a heat exchanger, a path member of combustion gas. Moreover, it is applied for an electromagnetic transmitting member. As such an electromagnetic transmitting member, an electromagnetic transmitting window, a high-frequency electrode device, a tube used for generating a high-frequency plasma, a doom used for generating a high-frequency plasma are explained. Further, it is applied for a substrate of a susceptor used for a supporting a semiconductor wafer. As such a susceptor, a ceramic electrostatic chuck, a ceramics heater, a high-frequency electrode device are explained. Furthermore, it is applied for a dummy wafer, a shadow ring, a lift pin for supporting a semiconductor wafer, parts for various kinds of semiconductor manufacturing apparatuses such as a shower plate and so on.

Hereinafter, actual experiments will be explained.

Experiment 1

A relation between an open angle of the corner portion and a peel-off condition of the silicon carbide film was examined.

As the substrate, use was made of a disc-shaped aluminum nitride sintered body having a diameter of 250 mm and a thickness of 20 mm. In the substrate, the step shown in FIG. 1 was arranged. A purity of aluminum nitride in the sintered body was 99.5%, and a remainder was yttria. A relative density of the sintered body was 99.9%.

The aluminum nitride substrate was set in the furnace for performing a chemical vapor deposition. A pressure during the film forming operation was 200 Torr. Only argon gas was flowed during a temperature ascending step till a film forming temperature (1425° C.), and then only hydrogen gas was flowed for 10 minutes at 1425° C. Then, hydrogen and silicon tetrachloride were flowed for 4 minutes, and then hydrogen, silicon tetrachloride and methane were flowed.

In FIG. 1, an open angle α of the corner portion 3A and an open angle β of the corner portion 3B were varied as shown in the following Table 1. The step H was 100 μm. A thickness of the silicon carbide film was 60 μm at a center of the film. A purity of the silicon carbide film was larger than 99.9999%. A relative density of respective silicon carbide films was larger than 99.9%, and the silicon carbide film was a densified body.

TABLE 1

| Open angle α of corner portion 3A | Open angle β of corner portion 3B | Peel-off generation condition |
|---|---|---|
| 90 | none | Generation at whole part (1a–1b) |
| 105 | 165 | Generation at part of 3A–1a |
| 120 | 150 | Generation at part of 3A-1a |
| 130 | 140 | none |
| 135 | 135 | none |
| 150 | 120 | Generation at part of 3B-1b |

Experiment 2

A relation between a curvature radius of the round portion and a peel-off condition of the silicon carbide film was examined.

As is the same as the experiment 1, the silicon carbide film was formed on a surface of the substrate as shown in FIG. 2.

Here, in FIG. 2, a curvature radius r of the round portion 5 was varied as shown in the following Table 2. The step H was 100 μm. A thickness of the silicon carbide film was 60 μm at a center of the film. A purity of the silicon carbide film was larger than 99.9999%. A relative density of respective silicon carbide films was larger than 99.9% and the silicon carbide film was a densified body.

TABLE 2

| Curvature radius of round portion 5 (mm) | Peel-off generation condition |
|---|---|
| 0.00 | Generation at whole part of Ia-5-1b |
| 0.02 | Generation at whole part of 1a-5-1b |
| 0.05 | none |
| 0.10 | none |
| 0.30 | none |
| 0.50 | none |

As mentioned above, according to the invention, it is possible to prevent a peel-off of the silicon carbide film at near the corner portion in the case that the substrate has the step in a method of forming the silicon carbide film on a surface face of the substrate made of aluminum nitride by a chemical vapor deposition method.

What is claimed is:

1. A film structure comprising a substrate made of aluminum nitride and a silicon carbide film formed on the substrate by a chemical vapor deposition method, wherein the substrate further comprises a first base plane, a second base plane positioned downwardly from the first base plane and a step plane arranged in an intersecting direction between the first base plane and the second base plane, and the silicon carbide film is formed on at least portions of the first base plane, the step plane and the second base plane of the substrate, wherein one or more chamfered planes are arranged between the first base plane and the step plane to form a plurality of corner portions each having an angle larger than 130°.

2. A film structure comprising a substrate made of aluminum nitride and a silicon carbide film formed on the substrate by a chemical vapor deposition method, wherein the substrate further comprises a first base plane, a second base plane positioned downwardly from the first base plane and a step plane arranged in an intersecting direction between the first base plane and the second base plane, and the silicon carbide film is formed on at least portions of the first base plane, the step plane and the second base plane of the substrate, wherein at least one round portion having a curvature radium of larger than 0.05 mm is arranged between the first base plane and the step plane.

3. The film structure according to claim 2, wherein the curvature radium of the round portion is 0.1 mm–0.3 mm.

4. The film structure according to claim 1, wherein a thickness of the silicon carbide film is larger than 50 μm.

5. The film structure according to claim 1, wherein the step plane between the first base plane and the second base plane is larger than 100 μm.

6. The film structure according to claim 2, wherein a thickness of the silicon carbide film is larger than 50 μm.

7. The film structure according to claim 2, wherein the step plane between the first base plane and the second base plane is larger than 100 μm.

* * * * *